United States Patent
Chen

(10) Patent No.: US 10,222,282 B2
(45) Date of Patent: Mar. 5, 2019

(54) FLYWHEEL TORSION MEASURING DEVICE WITH INTERNAL POWER

(71) Applicant: DIRECTION TECHNOLOGY CO., LTD., New Taipei (TW)

(72) Inventor: Yu-Yu Chen, New Taipei (TW)

(73) Assignee: Direction Technology Co., Ltd., New Taipei (TW)

( * ) Notice: Subject to any disclaimer, the term of this patent is extended or adjusted under 35 U.S.C. 154(b) by 0 days.

(21) Appl. No.: 15/867,817

(22) Filed: Jan. 11, 2018

(65) Prior Publication Data
US 2018/0292276 A1 Oct. 11, 2018

(30) Foreign Application Priority Data
Apr. 11, 2017 (TW) .............................. 106112068 A

(51) Int. Cl.
| | |
|---|---|
| *G01L 1/00* | (2006.01) |
| *G01L 5/00* | (2006.01) |
| *G01L 3/10* | (2006.01) |
| *H02N 99/00* | (2006.01) |
| *H05K 1/18* | (2006.01) |
| *A63B 22/06* | (2006.01) |
| *A63B 22/00* | (2006.01) |

(Continued)

(52) U.S. Cl.
CPC .............. *G01L 5/00* (2013.01); *A63B 21/225* (2013.01); *A63B 22/0076* (2013.01); *A63B 22/0605* (2013.01); *A63B 24/0062* (2013.01); *G01L 3/108* (2013.01); *H02N 99/00* (2013.01); *H05K 1/181* (2013.01); *A63B 2209/00* (2013.01); *A63B 2220/54* (2013.01); *A63B 2225/50* (2013.01); *H05K 2201/09009* (2013.01)

(58) Field of Classification Search
CPC ......... G01L 5/00; G01L 3/108; A63B 21/225; A63B 22/0076; A63B 22/0605; A63B 24/0062; A63B 2209/00; A63B 2220/54; A63B 2225/50; H02N 99/00; H05K 1/181; H05K 2201/09009
USPC ................................................... 73/862.338
See application file for complete search history.

(56) References Cited

U.S. PATENT DOCUMENTS 4,785,919 A * 11/1988 Mortimer .................. B60T 8/74
188/181 A
5,821,630 A * 10/1998 Schutten ................. H02J 9/066
290/30 R (Continued)

*Primary Examiner* — Max H Noori
(74) *Attorney, Agent, or Firm* — C. G. Mersereau; DeWitt LLP

(57) ABSTRACT

A flywheel torsion measuring device with internal power, applied to a shaft and a flywheel of sports equipment, has a wheel connector, a power unit, a torsion measuring element and circuit boards. The wheel connector, for fastening the flywheel and connecting the shaft through a bearing, has an assembly space and an annular plate. The power unit provides a power. The torsion measuring elements are disposed on the annular plate of the wheel connector, and the circuit board, which is disposed in the assembly space of the wheel connector and electrically connects the power unit and the torsion measuring elements, converts the power into a working power for the torsion measuring element. The wireless transmission module of the circuit board transmits the measurement information generated by the torsion measurement component to the outside.

20 Claims, 13 Drawing Sheets

(51) Int. Cl.
    *A63B 24/00*  (2006.01)
    *A63B 21/22*  (2006.01)

(56) References Cited

U.S. PATENT DOCUMENTS

| | | | | |
|---|---|---|---|---|
| 2005/0150281 A1* | 7/2005 | Schroeder | .............. | G01D 5/145 73/114.26 |
| 2009/0305796 A1* | 12/2009 | Widdall | .................... | F16D 1/06 464/147 |
| 2013/0009476 A1* | 1/2013 | Solis | ....................... | H02J 9/062 307/46 |

* cited by examiner

FLYWHEEL TORSION MEASURING DEVICE WITH INTERNAL POWER

BACKGROUND OF THE INVENTION

1. Field of the Invention

The present invention relates to a flywheel torsion measuring device, in particular to a flywheel torsion measuring device with internal power.

2. Description of the Prior Arts

Conventional sports equipment, such as an exercise bike, mainly comprises a body, a flywheel, a shaft, a resistance device and a transmission mechanism. The body is for a user to ride thereon. The shaft is fixed on the body and passes through the flywheel, so the flywheel can rotate relative to the shaft. The resistance device is disposed on the body to provide a resistance to the flywheel. For example, the transmission mechanism can be composed of a belt or a chain, a crank and a pedal, which is connected to the flywheel. When the user exerts force on the transmission mechanism, the transmission mechanism drives the flywheel to rotate relative to the shaft, and then the user can achieve exercise and fitness effects.

In order to detect the exercising status of the user when operating the sports equipment, the flywheel of the sports equipment is equipped with a measuring device, for example a strain gauge, for detecting the torsion. The measurement information generated by the measuring device can reflect the user's exercising status and can be transmitted wirelessly.

The measuring device requires a working power to start. The conventional sports equipment has a carbon brush set including a first carbon brush and a second carbon brush. The first carbon brush is disposed on the flywheel and electrically connected to the measuring device. The second carbon brush is disposed on the body and contacts the first carbon brush, so that the second carbon brush is electrically connected to the first carbon brush. The second carbon brush is connected to an external power supply device. Therefore, when the flywheel rotates, the first carbon brush moves relative to the second carbon brush to rub against each other and still maintains an electrical contact with the second carbon brush. The power supply device can generate a working power which is transmitted to the measuring device through the second carbon brush and the first carbon brush for activating the measuring device.

However, as the first carbon brush and the second carbon brush rub against each other, wear and tear occur between them when used for a long time, thereby resulting in poor contact and even electrical sparks. More importantly, electrical sparks are intrusive, which can easily cause signal transmission noise and even safety hazards.

To overcome the shortcomings, the present invention provides a flywheel torsion measuring device with internal power to mitigate or obviate the aforementioned problems.

SUMMARY OF THE INVENTION

The present invention provides a flywheel torsion measuring device with internal power. By self-generating power, the present invention overcomes the wear and tear, the bad contact and the electric spark caused by the carbon brush set.

The flywheel torsion measuring device with internal power is applied to a shaft and a flywheel of sports equipment, the shaft is fixed to a frame, and the flywheel torsion measuring device with internal power comprises:

a wheel connector for fastening the flywheel and connecting the shaft through a bearing, wherein the wheel connector has a assembly space extending axially and an annular plate extending radially;

a power unit disposed on the wheel connector to provide a power;

at least one torsion measuring element disposed on the annular plate of the wheel connector; and at least one circuit board disposed in the assembly space of the wheel connector and electrically connecting the power unit and the at least one torsion measuring element, wherein the at least one circuit board has a power module and a wireless transmission module, the wireless transmission module externally transmits the measurement information generated by the at least one torsion measuring element and the power module converts the power into a working power for applying to the at least one torsion measuring element and the wireless transmission module.

In the flywheel torsion measuring device with internal power of the present invention, the power unit provides the power for the circuit board through the contactless method, and the circuit board converts the power into a working power for the torsion measuring element, thereby achieving the self-power-generating effect. The present invention does not use the conventional carbon brush set, thereby avoiding wear and tear, the bad contact and the electric spark caused by the carbon brush. Therefore, compared with the conventional carbon brush set, the reliability of the power supply of the present invention is greatly improved.

Other objectives, advantages and novel features of the invention will become more apparent from the following detailed description when taken in conjunction with the accompanying drawings.

DETAILED DESCRIPTION OF THE PREFERRED EMBODIMENTS

The flywheel torsion measuring device with internal power of the invention is applied to sports equipment. The sports equipment may be, but not limit to, an exercise bike, a rower machine, a bike trainer, a magnetic control exercise bike or a spinning bike. The sports equipment mainly comprises a frame, a flywheel, a shaft, a resistance device and a transmission mechanism. The frame is for a user to ride thereon, the shaft is fixed on the frame, the flywheel can rotate relative to the shaft, and the resistance device is disposed on the frame to provide a resistance to the flywheel. The transmission mechanism connecting to the flywheel may be composed of a belt or a chain, a crank and a pedal. When the user exerts force on the transmission mechanism, the flywheel can be driven by the transmission mechanism to rotate relative to the shaft, and the user can achieve exercise and fitness effects.

FIGS. 1 to 4 show a first embodiment of the present invention. The flywheel torsion measuring device comprises a wheel connector 10, a power unit 20 (as shown in FIG. 5), at least one torsion measuring element 30 and at least one circuit board.

Figure 1:
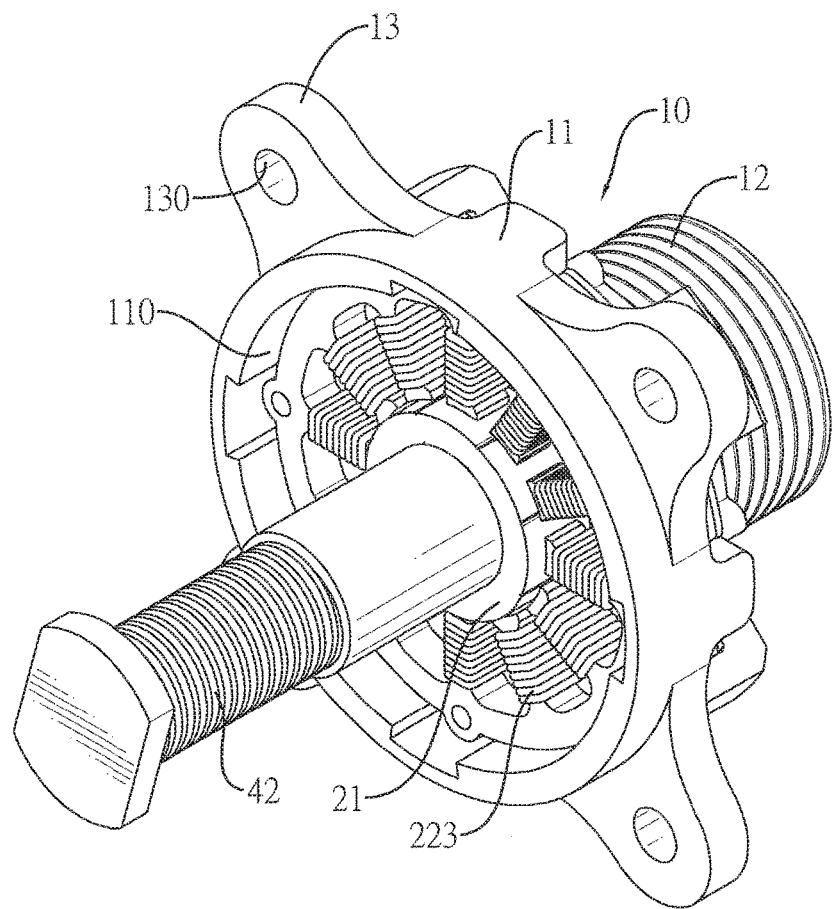
FIG. 1 is a perspective view of a first embodiment in accordance with the present invention.
Figure 2:
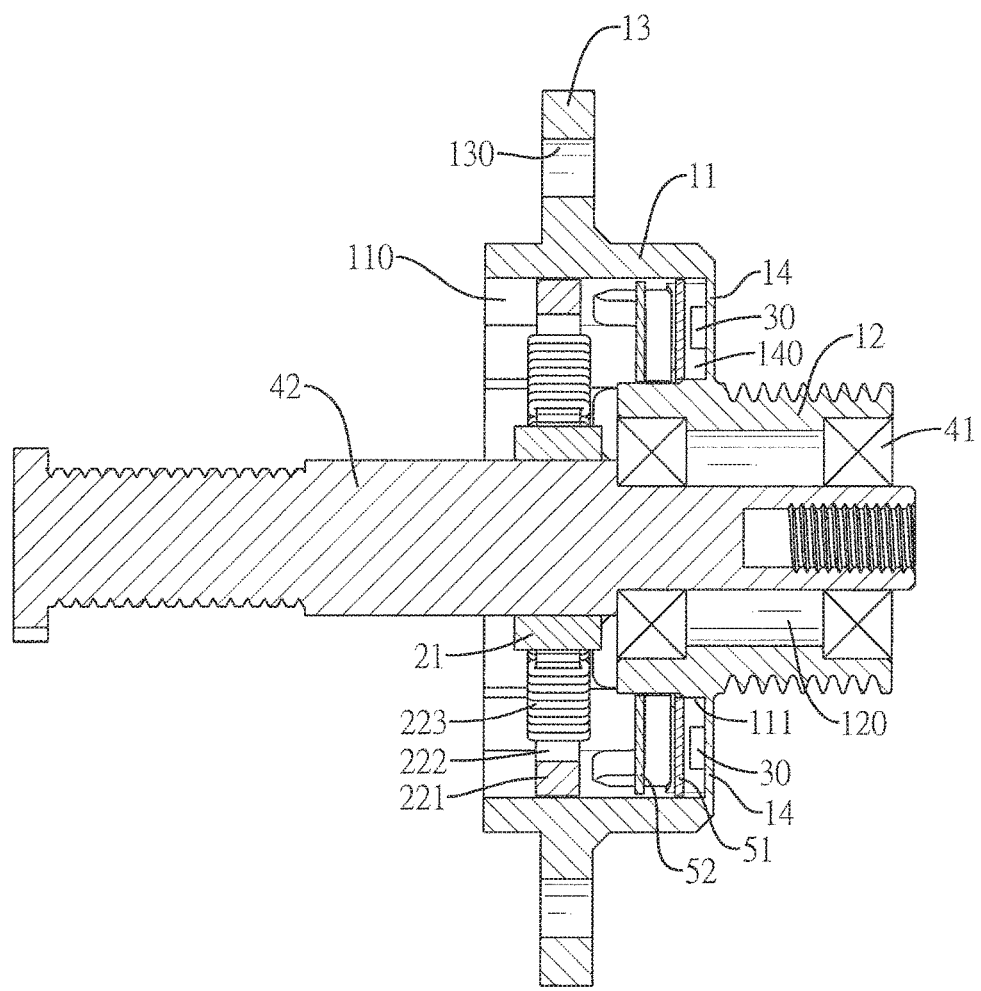
FIG. 2 is a sectional view of the first embodiment in accordance with the present invention.
Figure 3:
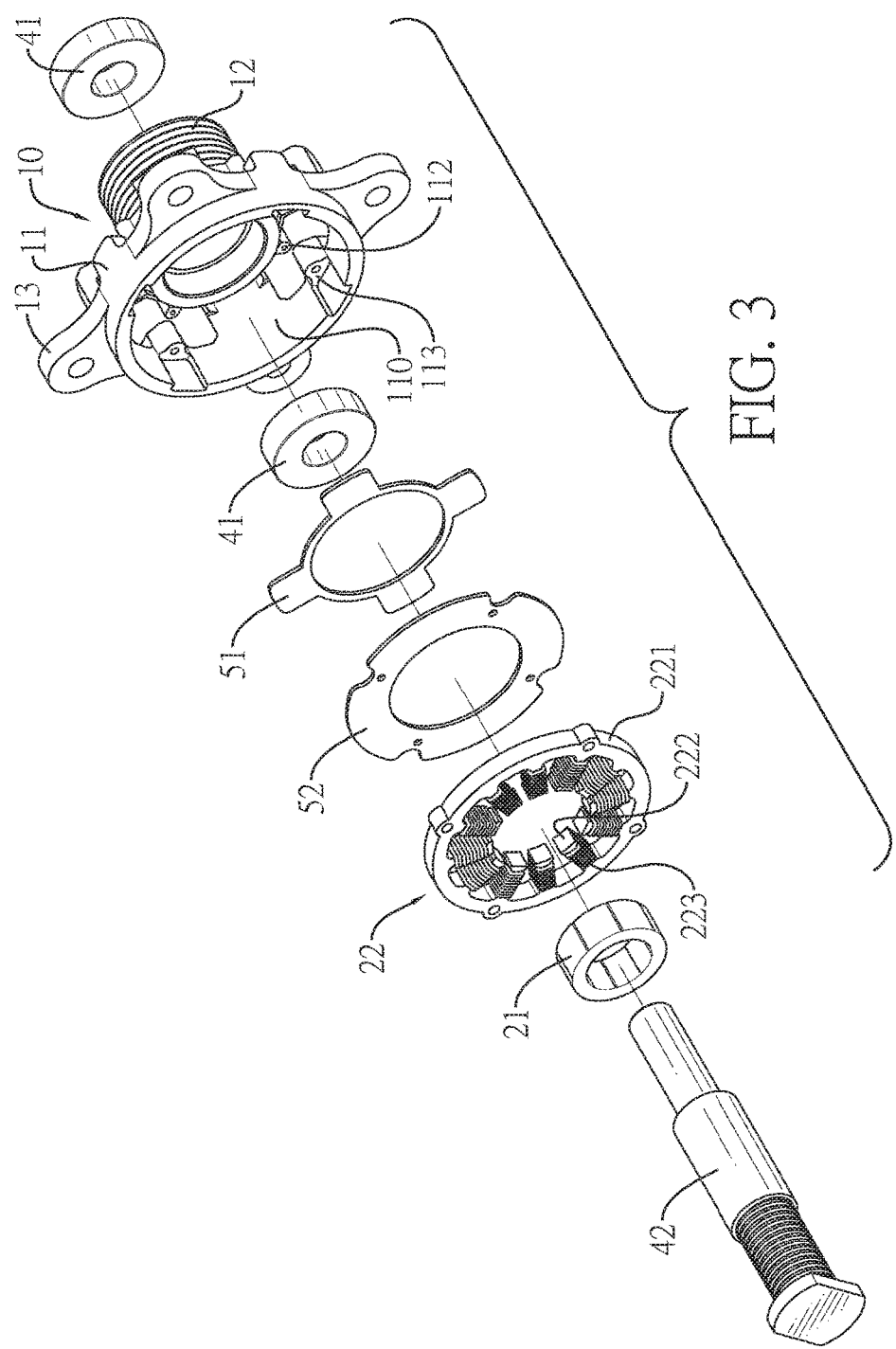
FIG. 3 is an exploded view of the first embodiment in accordance with the present invention.
Figure 4:
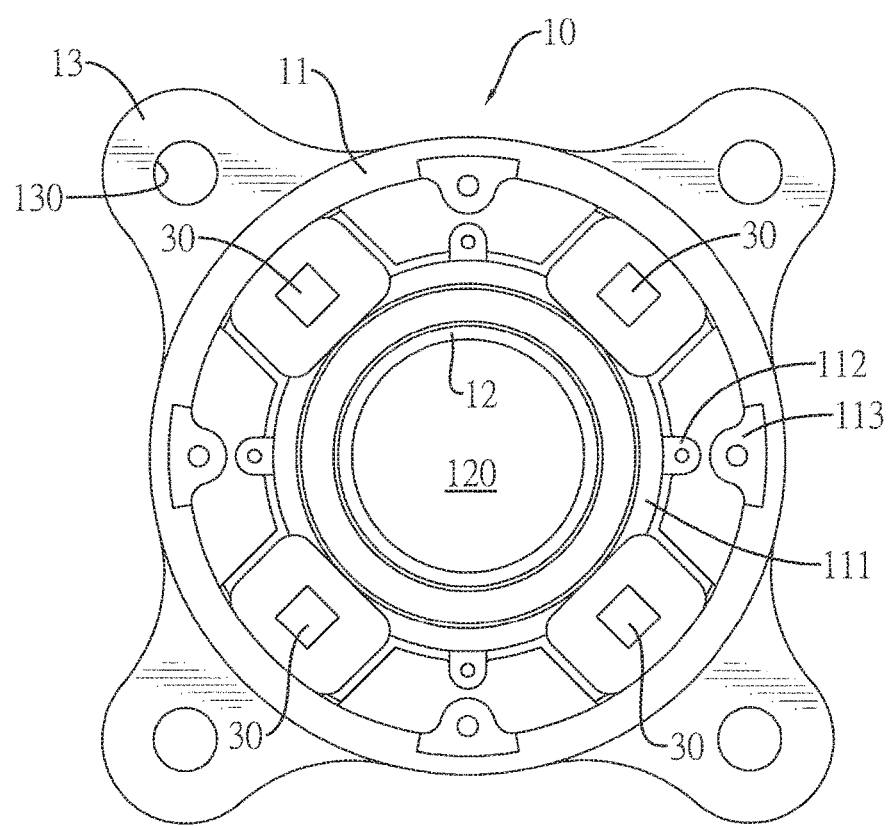
FIG. 4 is a top view of the wheel connector according to the first embodiment of the present invention.
Figure 6:
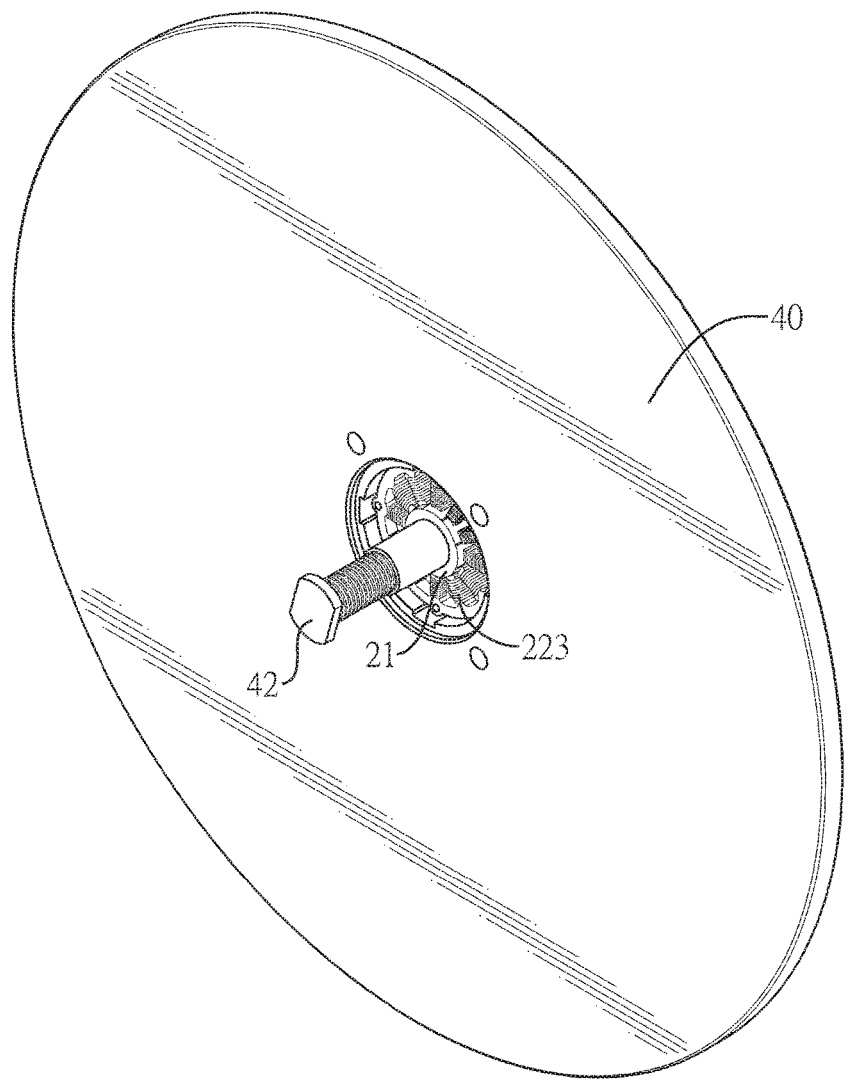
FIG. 6 is a first perspective view of the first embodiment connecting to the flywheel in accordance with the present invention.
Figure 7:
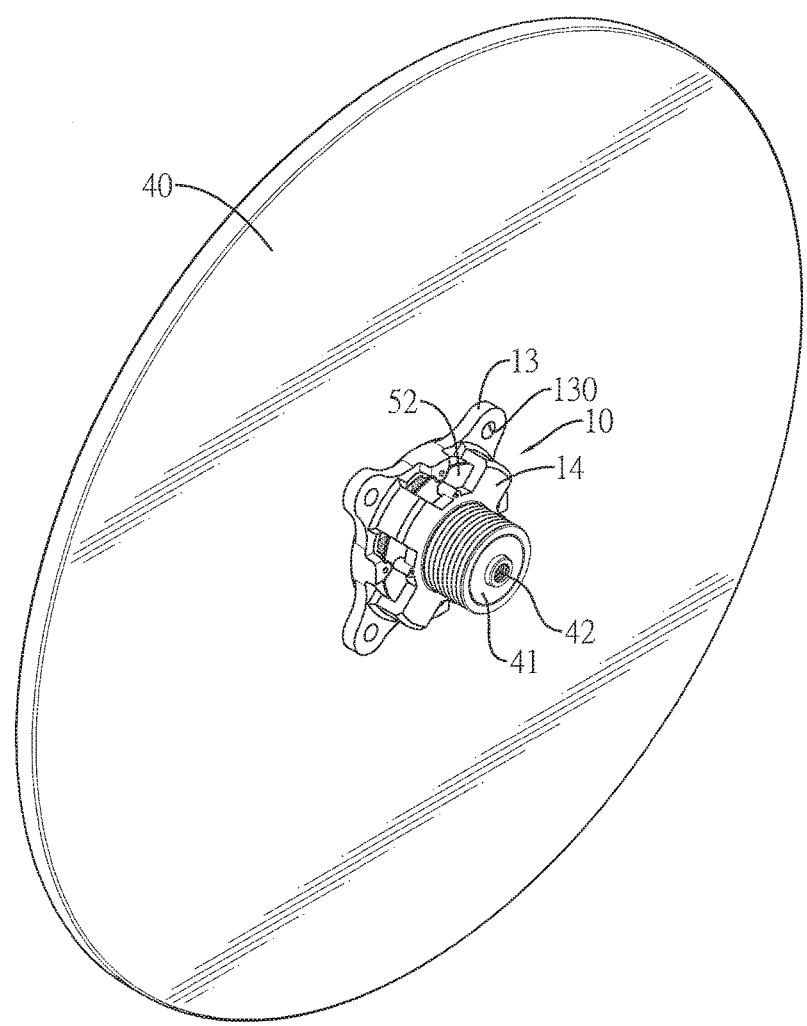
FIG. 7 is a second perspective view of the first embodiment connecting to the flywheel in accordance with the present invention.
Figure 8:
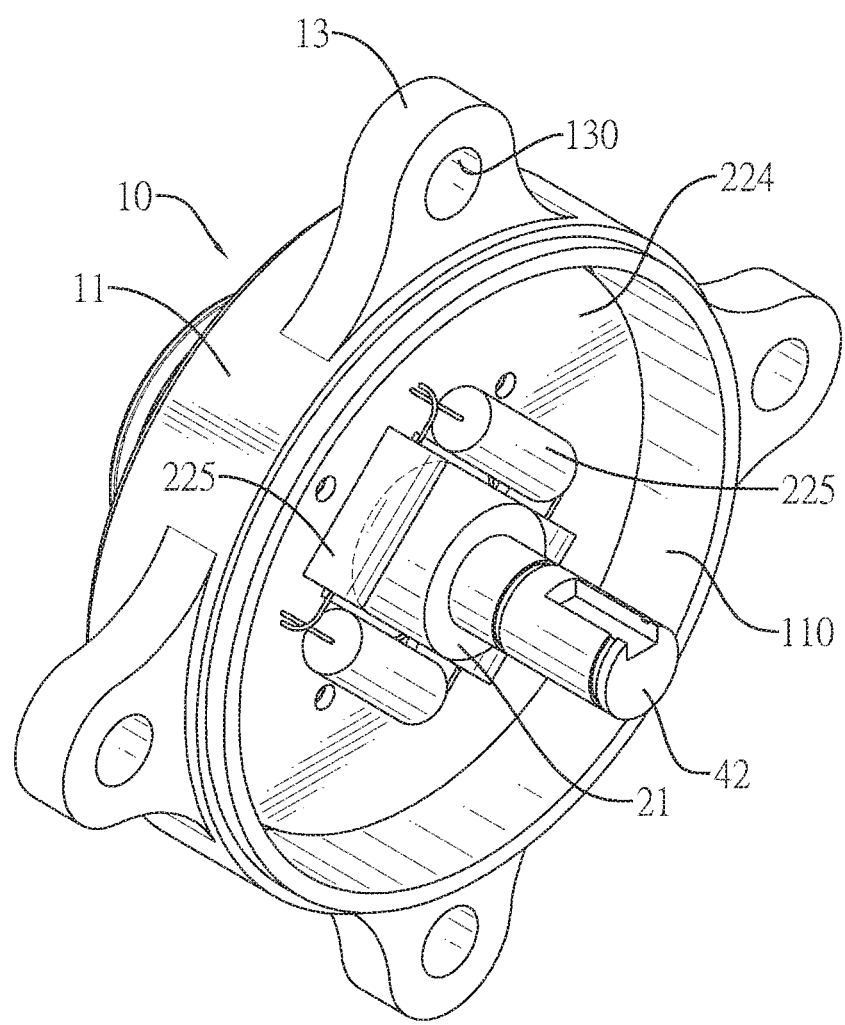
FIG. 8 is a first perspective view of a second embodiment in accordance with the present invention.

The wheel connector 10 may be made of aluminum alloy. Referring to FIG. 6 and FIG. 7, the wheel connector 10 is to be fixed to the flywheel 40 of the sports equipment and connected to a shaft 42 of the sports equipment through a bearing 41. Referring to FIG. 2 and FIG. 3, the wheel connector 10 has a body 11 and a transmission component 12. An assembly space 110 is defined in the body 11 and extends along an axial direction. An opening communicates with the assembly space 110 at one end of the body 11 in the axial direction, so the assembly space 110 can be exposed to the body 11. A plurality of fixing holes 130 is formed on the body 11. For example, a plurality of fixing plates 13 can extend radially from an outer circumference of the body 11, and the plurality of fixing holes 130 are respectively formed on the plurality of fixing plates 13. The fixing plates 13 are arranged around the circumference of the body 11. With reference to FIG. 7, the fixing holes 130 can be disposed on the flywheel 40 by fastening components (not shown), such as bolts, nuts, or the like. The combination of the wheel connector 10 and the flywheel 40 is not limited thereto. Referring to FIG. 2, the transmission component 12 can be, but not limited to, a belt pulley. The transmission component 12 is connected to the other end of the body 11 opposite to the opening in the axial direction. The transmission component 12 has a shaft hole 120 communicating with the assembly space 110 and extending axially. The bearing 41 is disposed in the shaft hole 120 of the transmission component 12 for mounting around the shaft 42. As shown in FIG. 2, the shaft 42 passes through the body 11 and the transmission component 12. In the embodiment of the present invention, as shown in FIG. 2 and FIG. 4, the wheel connector 10 includes an annular plate 14. For example, the annular plate 14 radially extends from an outer circumference of the transmission component 12, and an outer circumference of the annular plate 14 is connected to the other end of the body 11 opposite to the opening. The body 11, the annular plate 14 and the transmission component 12 are integratedly formed together. Thereby, when the flywheel 40 rotates, the wheel connector 10 also rotates relative to the shaft 42.

Figure 5:
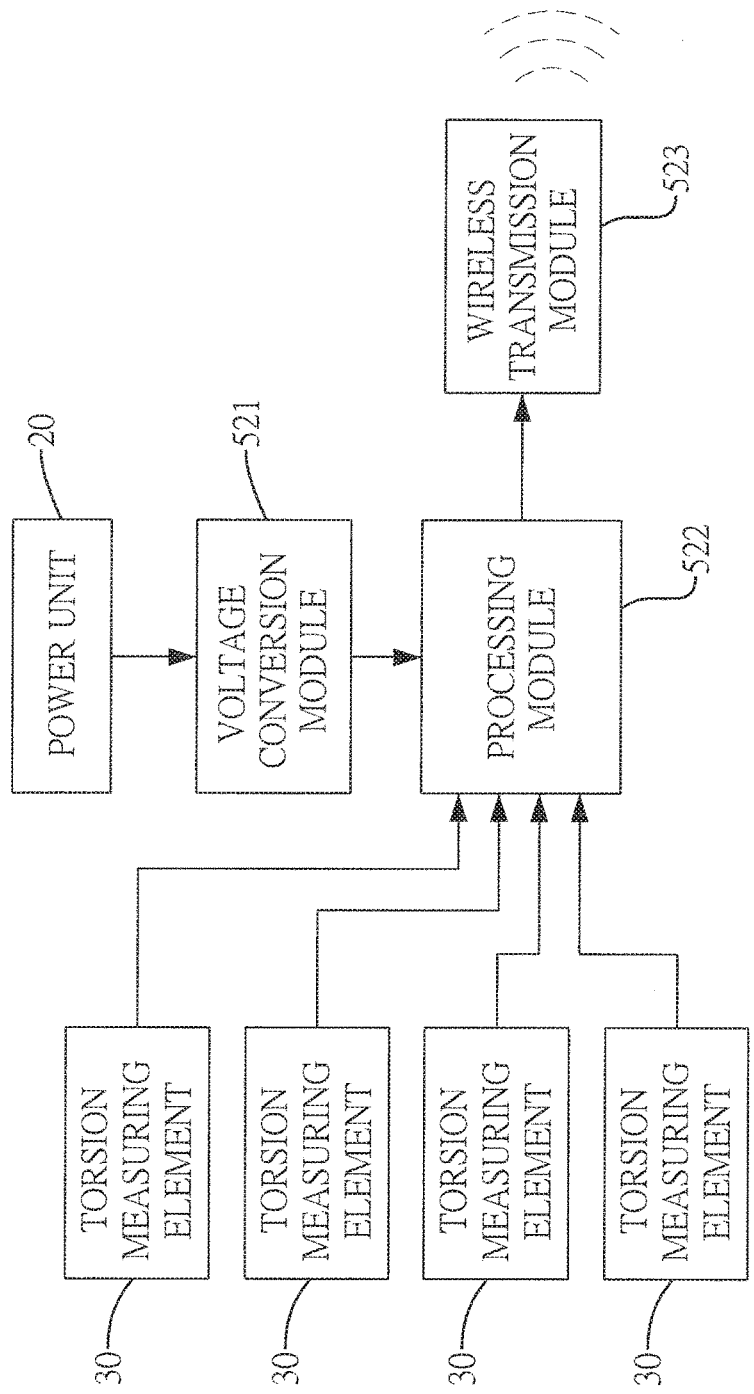
FIG. 5 is a circuit diagram in accordance with the present invention.

With reference to FIG. 2, FIG. 3 and FIG. 5, the power unit 20 may have a magnet 21 and an inductive power generation assembly 22. The magnet 21 is a ring-shaped magnet which is fixed around the outer circumference of the shaft 42 and located in the assembly space 110. The inductive power generation assembly 22 is fixed in the assembly space 110 of the wheel connector 10. The position of the inductive power generation assembly 22 corresponds to the position of the magnet 21 to generate a power (induction power) when the inductive power generation assembly 22 rotates relative to the magnet 21. In the first embodiment, the inductive power generation assembly 22 has a silicon steel frame 221, multiple columns 222 and multiple inductive coils 223. The silicon steel frame 221 has an inner surface that faces a surface of the shaft 42. The multiple columns 222 are on the inner surface of the silicon steel frame 221 and extend toward the magnet 21. A gap is formed between ends of the columns 222 and a surface of the magnet 21. The multiple inductive coils 223 are twined around the multiple columns 222 respectively. When the wheel connector 10 rotates relative to the shaft 42, the inductive power generation assembly 22 also rotates relative to the magnet 21, so that the moving inductive coils 223 cut the magnetic lines of the magnet 21 to generate the power.

In other embodiments, the power unit 20 may be a battery (not shown) disposed on the at least one circuit board to provide the power.

With reference to FIG. 2, FIG. 4 and FIG. 5, the torsion measuring element 30 may be a load cell sensor or a strain gauge sensor, which is disposed on an inner surface or an outer surface of the annular plate 14. The inner surface of the annular plate 14 faces the assembly space 110, and the outer surface of the annular plate 14 faces outwardly relative to the inner surface. The inner surface or the outer surface of the annular plate 14 may be provided with a groove 140 (as shown in FIG. 2), and the groove 140 has a bottom surface. The torsion measuring element 30 has a measuring surface that can be attached to the inner surface or the outer surface of the annular plate 14, for example, attached to the bottom surface of the groove 140. The torsion measuring element 30 generates measurement information. For example, the measurement information is a resistor value that may change according to the strain of the annular plate 14. With reference to FIG. 4, an embodiment of the present invention includes four torsion measuring elements 30 disposed on the inner surface of the annular plate 14 along a moving trace. The moving trace is a movement path of each torsion measuring element 30 along with the rotation of the wheel connector 10.

The at least one circuit board is disposed in the assembly space 110 of the wheel connector 10 and electrically connected to the inductive power generation assembly 22 and the at least one torsion measuring element 30, so as to convert the power into a working power for applying to the at least one torsion measuring element 30. With reference to FIG. 2 and FIG. 3, in the first embodiment, the at least one circuit board comprises a first circuit board 51 and a second circuit board 52. Further with reference to FIG. 4, the assembly space 110 of the body 11 has a first setting part 111, a second setting part 112 and a third setting part 113. The setting parts 111-113 are respectively located on different planes and are sequentially arranged from the inside to the outside of the body 11. The first circuit board 51 is disposed on the first setting part 111, the second circuit board 52 is disposed on the second setting part 112, and the silicon steel frame 221 of the inductive power generation assembly 22 is disposed on the third setting part 113. Therefore, there are a space between the first circuit board 51 and the second circuit board 52, and a space between the second circuit board 52 and the inductive power generation assembly 22. The first circuit board 51 can be electrically connected to the torsion measuring element 30 through a wire (not shown). The second circuit board 52 can be electrically connected to the first circuit board 51 and the inductive coils 223 of the inductive power generation assembly 22 through wires (not shown). In other words, the second circuit board 52 is indirectly connected to the torsion measuring element 30 through the first circuit board 51.

With reference to FIGS. 3 to 5, the second circuit board 52 has a voltage conversion module 521, a processing module 522 and a wireless transmission module 523. The voltage conversion module 521, the processing module 522 and the wireless transmission module 523 may be electronic components, such as integrated circuits (IC), resistors, inductors, capacitors and so on. The input terminal of the voltage conversion module 521 is electrically connected to the inductive power generation assembly 22 of the power unit 20. The output terminal of the voltage conversion module 521 is electrically connected to the at least one torque measuring element 30, the processing module 522 and the wireless transmission module 523. Then, the voltage conversion module 521 converts the power into the working power for the torsion measuring element 30, the processing module 522 and the wireless transmission module 523. The processing module 522 is electrically connected to the at least one torsion measuring element 30 and the wireless transmission module 523 so as to transmit the measurement information of the at least one torsion measuring element 30 to the outside through the wireless transmission module 523. For example, the wireless transmission module 523 can be electrically connected to a user electronic device (such as a tablet or a smart phone) to transmit the measurement information to the user electronic device that executes the application (APP). In addition, the processing module 522 can be electrically connected to any inductive coils 223. As the induction power waveform generated by the inductive coils 223 is periodic, the processing module 522 can calculate the revolving speed of the flywheel 40 according to the induced power waveform.

Referring to FIGS. 8 to 11, in the second embodiment, the at least one circuit board may be one single circuit board 224. The inductive power generation assembly 22 includes multiple power generation coils 225. The circuit board 224 is fixed in the assembly space 110 of the wheel connector 10. A hole 226 is at the center of the circuit board 224 for the shaft 42 to pass through. The magnet 21 in the assembly space 110 may be located outside the circuit board 224. The power generation coils 225 are disposed on the circuit board 224 and surround the hole 226. Therefore, the positions of the power generation coils 225 correspond to the position of the magnet 21 and surround the magnet 21. When the wheel connector 10 rotates relative to the shaft 42, the inductive power generation assembly 22 also rotates relative to the magnet 21, so that the moving power generation coils 225 cut the magnetic lines of the magnet 21 to generate the power.

Figure 9:
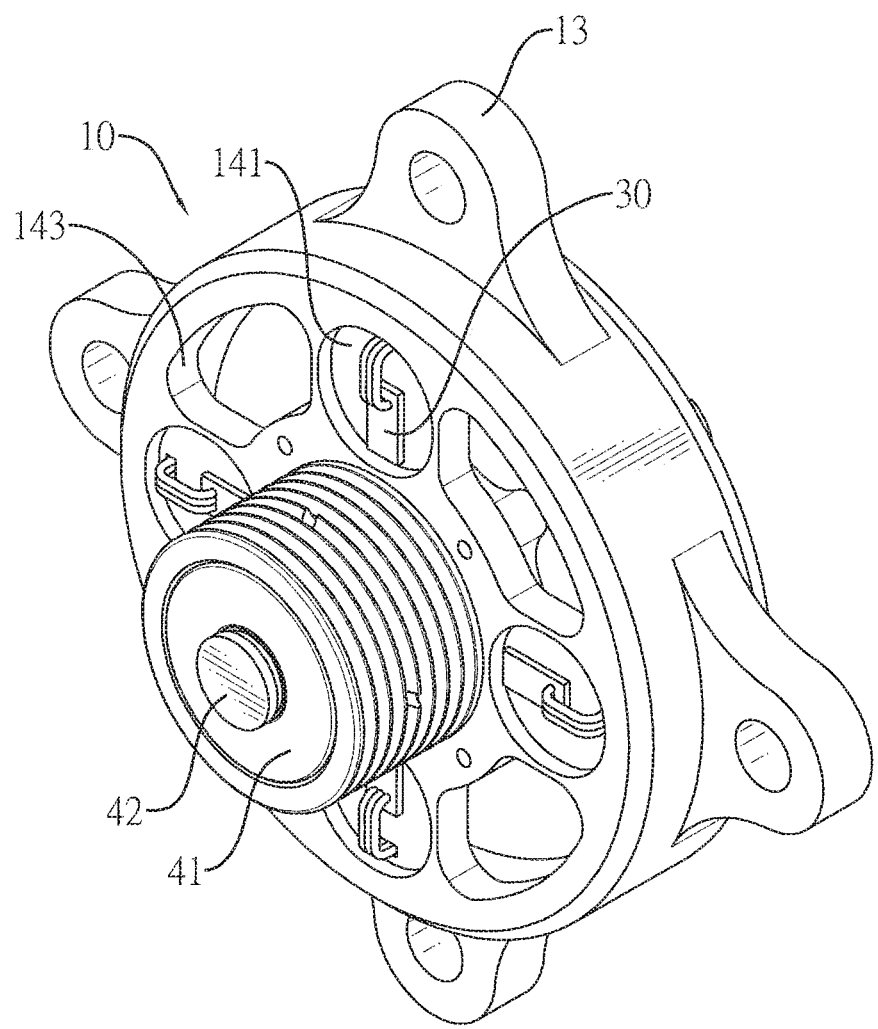
FIG. 9 is a second perspective view of the second embodiment in accordance with the present invention.
Figure 10:
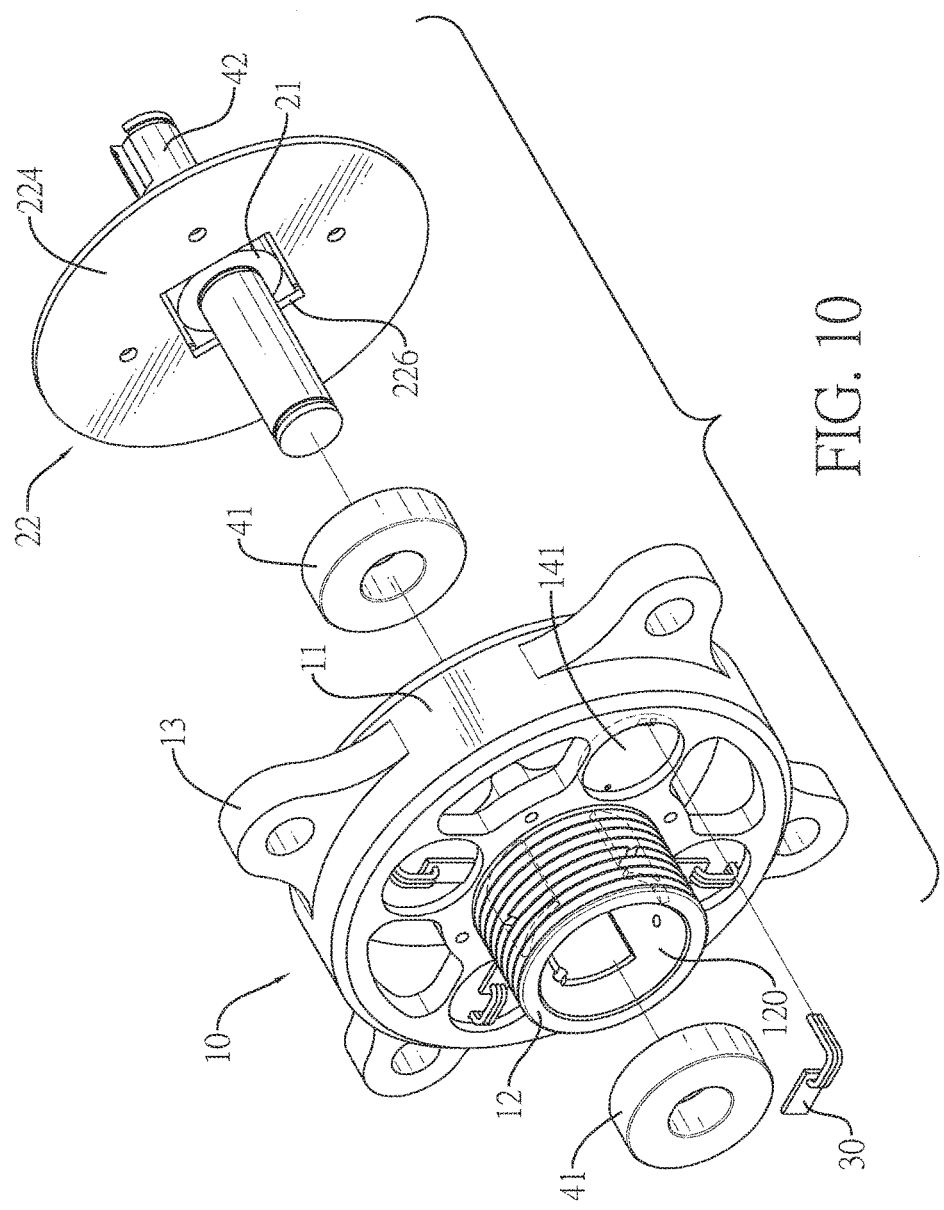
FIG. 10 is an exploded view of the second embodiment in accordance with the present invention.
Figure 11:
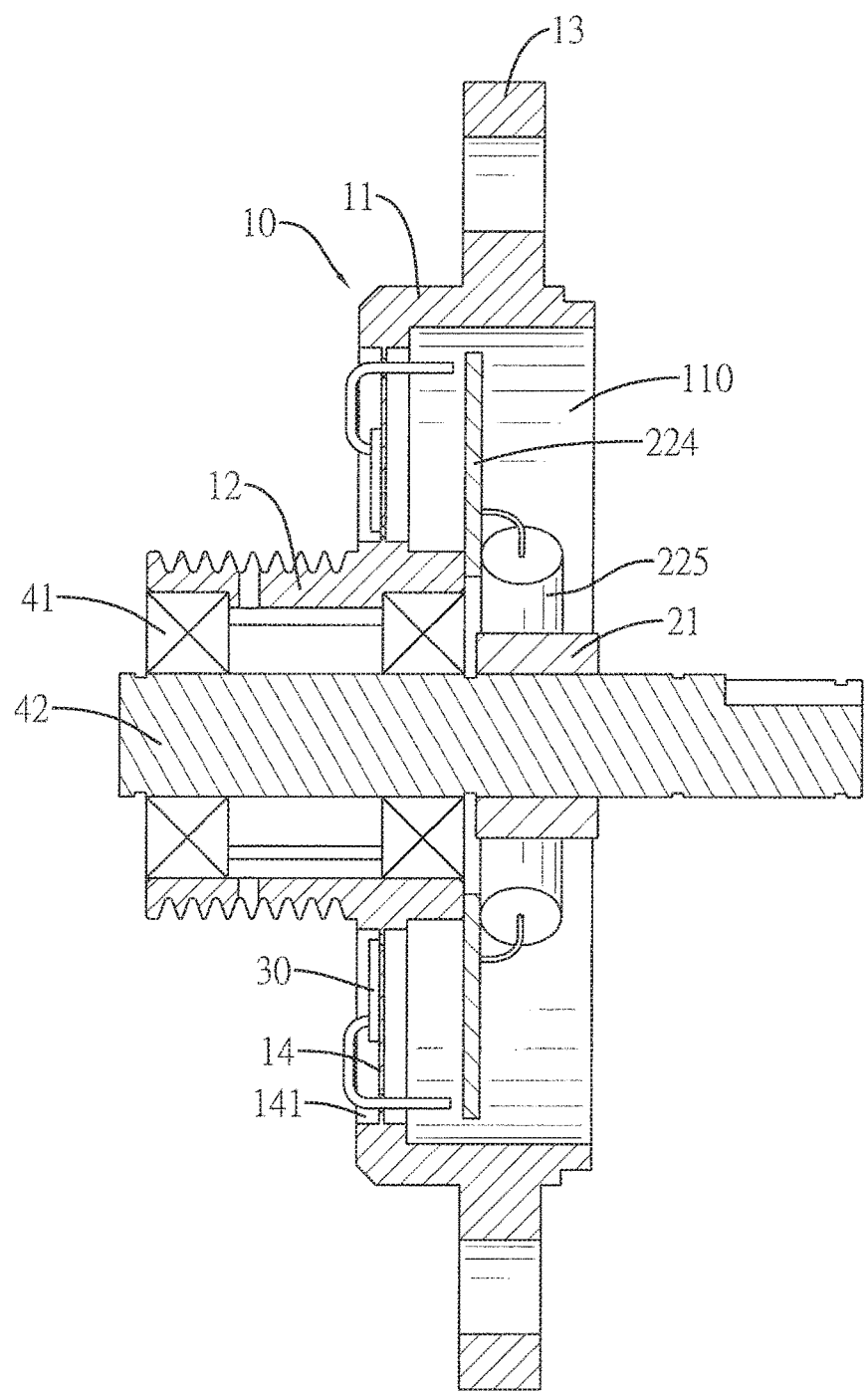
FIG. 11 is a sectional view of the second embodiment in accordance with the present invention.
Figure 12:
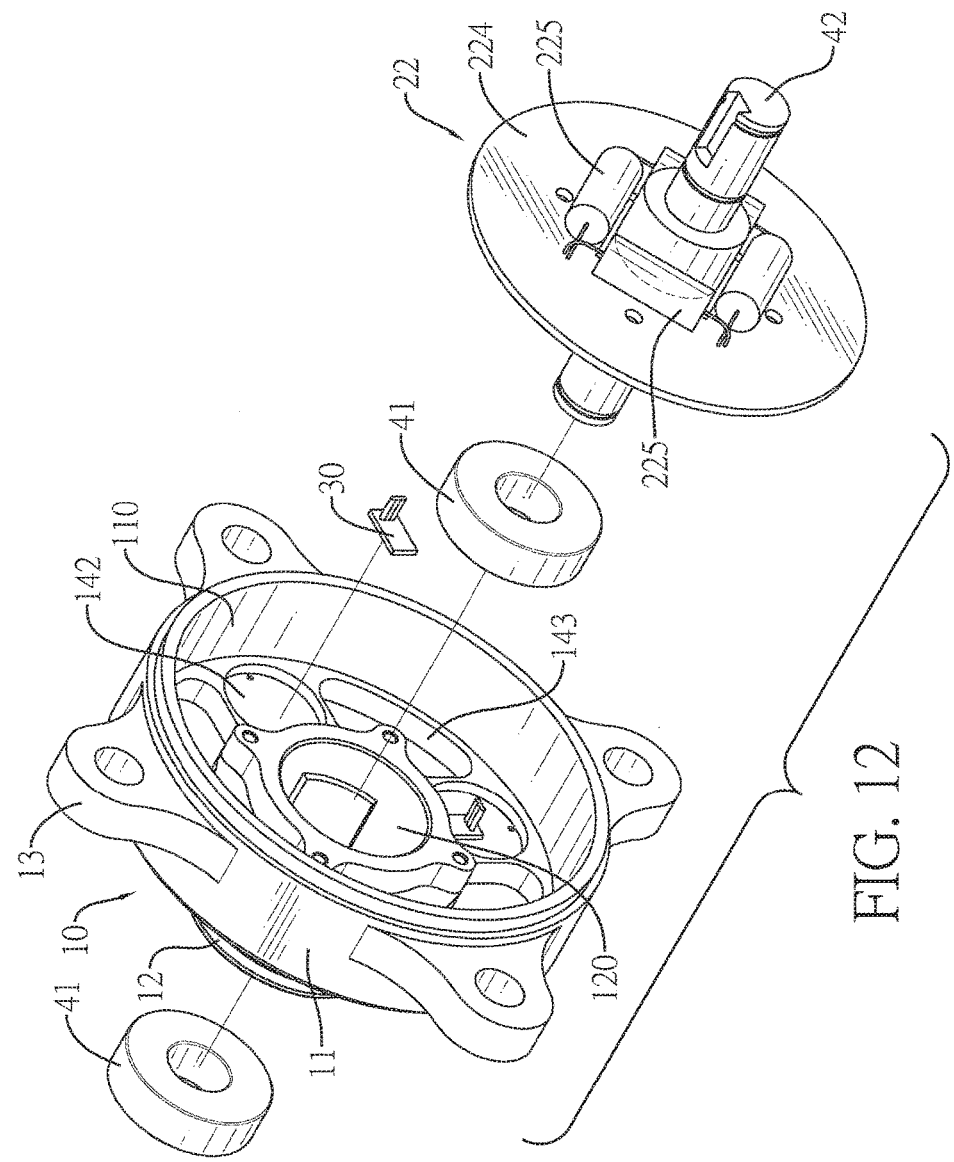
FIG. 12 is an exploded view of a third embodiment in accordance with the present invention.
Figure 13:
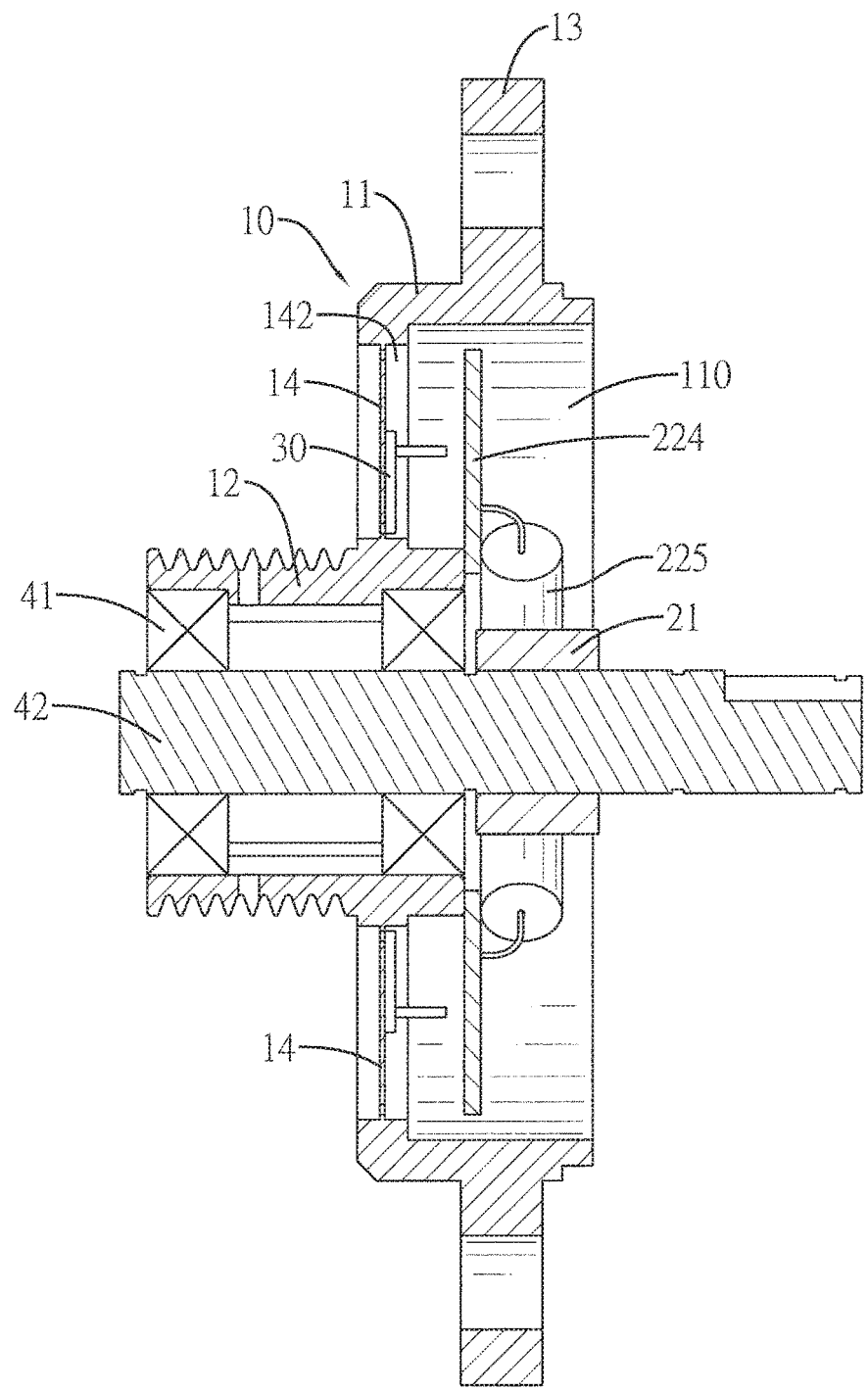
FIG. 13 is a sectional view of the third embodiment in accordance with the present invention.

Referring to FIGS. 9 to 11, the outer surface of the annular plate 14 of the wheel connector 10 can form multiple grooves 141 surrounding the transmission component 12. The torsion measuring elements 30 are respectively disposed on bottom surfaces of the grooves 141 so that the torsion measuring elements 30 can be distributed on the outer surface of the annular plate 14 along the moving trace. On the other hand, in the third embodiment, referring to FIG. 12 and FIG. 13, the inner surface of the annular plate 14 of the wheel connector 10 can form multiple grooves 142 surrounding the transmission component 12. The torsion measuring elements 30 are respectively disposed on bottom surfaces of the grooves 142 so that the torsion measuring elements 30 can be distributed on the outer surface of the annular plate 14 along the moving trace. In addition, referring to FIG. 9, the annular plate 14 can form an opening 143 for wiring installation, such as connecting the torsion measuring element 30 to the circuit board 224 by wires.

In summary, in the present invention, the power is generated by the power unit 20, that is, the power is generated by non-contact electromagnetic induction, and the power is converted into the working power by the circuit board to be provided to the torque measuring element 30 or other electronic components. Compared with the common contact-type carbon brush set, the power unit 20 of the present invention adopts the non-contact induction power generation method to overcome the wear and tear, poor contact and electrical sparking, thereby greatly improving the reliability of the power supply of the present invention.

Even though numerous characteristics and advantages of the present invention have been set forth in the foregoing description, together with details of the structure and features of the invention, the disclosure is illustrative only. Changes may be made in the details, especially in matters of shape, size, and arrangement of parts within the principles of the invention to the full extent indicated by the broad general meaning of the terms in which the appended claims are expressed.

What is claimed is:

1. A flywheel torsion measuring device with internal power, the flywheel torsion measuring device applied to a shaft and a flywheel of sports equipment, the shaft fixed to a frame, and the measuring device comprising:
    a wheel connector to be mounted to the flywheel and connected to the shaft through a bearing, wherein the wheel connector has an assembly space extending axially and an annular plate extending radially;
    a power unit disposed on the wheel connector to provide a power;
    at least one torsion measuring element disposed on the annular plate of the wheel connector; and
    at least one circuit board disposed in the assembly space of the wheel connector and electrically connected to the power unit and the at least one torsion measuring element, wherein the at least one circuit board has a power module and a wireless transmission module, the wireless transmission module transmits measurement information generated by the at least one torsion measuring element externally and the power module converts the power into a working power for applying to the at least one torsion measuring element and the wireless transmission module.

2. The flywheel torsion measuring device as claimed in claim 1, wherein the power unit has:
    a magnet fixed on the shaft and located in the assembly space; and
    an inductive power generation assembly fixed in the assembly space of the wheel connector, wherein the position of the inductive power generation assembly corresponds to the position of the magnet to generate a power when rotating relative to the magnet, and the power is induction power.

3. The flywheel torsion measuring device as claimed in claim 1, wherein the power unit is a battery disposed on the at least one circuit board to generate the power.

4. The flywheel torsion measuring device as claimed in claim 2, wherein the magnet is a ring-shaped magnet which is fixed on an outer circumference of the shaft and located in the assembly space;
the inductive power generation assembly has:
a silicon steel frame fixed in the assembly space of the wheel connector, wherein the silicon steel frame has an inner surface facing to the shaft;
multiple columns formed on the inner surface of the silicon steel frame and extending toward the magnet, wherein a gap is formed between ends of the columns and a surface of the magnet; and
multiple inductive coils twined around the multiple columns respectively to generate the power when rotating relative to the magnet.

5. The flywheel torsion measuring device as claimed in claim 4, wherein the wheel connector has:
a body having the assembly space, wherein the assembly space has a first setting part, a second setting part and a third setting part that are respectively located on different planes and are sequentially arranged from the inside to the outside of the body; and
a transmission component having a shaft hole that communicates with the assembly space and extends axially, wherein the bearing is disposed in the shaft hole of the transmission component, the annular plate radially extends from an outer circumference of the transmission component, an outer circumference of the annular plate is connected to an end of the body, and the body, the annular plate and the transmission component are integratedly formed together.

6. The flywheel torsion measuring device with as claimed in claim 1, wherein the at least one circuit board is one single circuit board having a hole at the center of the circuit board for the shaft to pass through;
the magnet is a ring-shaped magnet which is fixed on the outer circumference of the shaft and located in the assembly space;
the inductive power generation assembly has multiple inductive coils disposed on the circuit board and surrounding the hole, wherein the position of the inductive power generation assembly corresponds to the position of the magnet and surrounds the magnet to generate a power when rotating relative to the magnet.

7. The flywheel torsion measuring device as claimed in claim 6, wherein the wheel connector has:
a body having the assembly space; and
a transmission component having a shaft hole that communicates with the assembly space and extends axially, wherein the bearing is disposed in the shaft hole of the transmission component, the annular plate radially extends from an outer circumference of the transmission component, an outer circumference of the annular plate is connected to an end of the body, and the body, the annular plate and the transmission component are integratedly formed together.

8. The flywheel torsion measuring device as claimed in claim 5, wherein the body has multiple fixing holes arranged annularly at intervals for fixing the flywheel.

9. The flywheel torsion measuring device as claimed in claim 7, wherein the body has multiple fixing holes arranged annularly at intervals for fixing the flywheel.

10. The flywheel torsion measuring device as claimed in claim 1, wherein the annular plate has an inner surface and an outer surface, wherein the inner surface faces the assembly space, the outer surface faces outwardly relative to the inner surface, and the inner surface is formed with a groove;
the torsion measuring element has a measuring surface attached to a bottom surface of the groove.

11. The flywheel torsion measuring device as claimed in claim 2, wherein the annular plate has an inner surface and an outer surface, wherein the inner surface faces the assembly space, the outer surface faces outwardly relative to the inner surface, and the inner surface is formed with a groove;
the torsion measuring element has a measuring surface attached to a bottom surface of the groove.

12. The flywheel torsion measuring device as claimed in claim 3, wherein the annular plate has an inner surface and an outer surface, wherein the inner surface faces the assembly space, the outer surface faces outwardly relative to the inner surface, and the inner surface is formed with a groove;
the torsion measuring element has a measuring surface attached to a bottom surface of the groove.

13. The flywheel torsion measuring device as claimed in claim 4, wherein the annular plate has an inner surface and an outer surface, wherein the inner surface faces the assembly space, the outer surface faces outwardly relative to the inner surface, and the inner surface is formed with a groove;
the torsion measuring element has a measuring surface attached to a bottom surface of the groove.

14. The flywheel torsion measuring device as claimed in claim 5, wherein the annular plate has an inner surface and an outer surface, wherein the inner surface faces the assembly space, the outer surface faces outwardly relative to the inner surface, and the inner surface is formed with a groove;
the torsion measuring element has a measuring surface attached to a bottom surface of the groove.

15. The flywheel torsion measuring device as claimed in claim 1, wherein the wireless transmission module is connected to a user electronic device for transmitting the measurement information to the user electronic device executing an application program.

16. The flywheel torsion measuring device as claimed in claim 2, wherein the wireless transmission module is connected to a user electronic device for transmitting the measurement information to the user electronic device executing an application program.

17. The flywheel torsion measuring device as claimed in claim 3, wherein the wireless transmission module is connected to a user electronic device for transmitting the measurement information to the user electronic device executing an application program.

18. The flywheel torsion measuring device as claimed in claim 4, wherein the wireless transmission module is connected to a user electronic device for transmitting the measurement information to the user electronic device executing an application program.

19. The flywheel torsion measuring device as claimed in claim 5, wherein the wireless transmission module is connected to a user electronic device for transmitting the measurement information to the user electronic device executing an application program.

20. The flywheel torsion measuring device as claimed in claim 4, wherein the circuit board has a processing module which is electrically connected to any inductive coils for calculating the rotation speed of the flywheel based on the induced power waveform generated by the inductive coils.

* * * * *